United States Patent [19]

Huang et al.

[11] 4,076,557
[45] Feb. 28, 1978

[54] METHOD FOR PROVIDING SEMICONDUCTOR DEVICES

[75] Inventors: Jack S. T. Huang, New Hope, Minn.; Susumu Kohyama, Kawasaki, Japan

[73] Assignee: Honeywell Inc., Minneapolis, Minn.

[21] Appl. No.: 715,737

[22] Filed: Aug. 19, 1976

[51] Int. Cl.² .................................... H01L 21/26
[52] U.S. Cl. ................................ 148/1.5; 148/187; 29/578
[58] Field of Search ............... 148/1.5, 187; 29/578

[56] References Cited

U.S. PATENT DOCUMENTS

| 3,838,438 | 9/1974 | Silversmith et al. | 357/24 |
| 3,853,634 | 12/1974 | Amelio et al. | 148/1.5 |
| 3,865,652 | 2/1975 | Agusta et al. | 148/187 |
| 3,927,468 | 12/1975 | Anthony et al. | 29/578 |
| 3,930,893 | 1/1976 | Tchon | 148/1.5 |
| 3,931,674 | 1/1976 | Amelio | 29/578 |

OTHER PUBLICATIONS

Krambeck et al., IEEE Transactions on Electron Devices, vol. ED-21, No. 1, Jan. 1974, pp. 70-72.
Krambeck et al., IEEE Journal of Solid-State Circuits, vol. SC-9, No. 6, Dec. 1974, pp. 436-443.

Primary Examiner—G. Ozaki
Attorney, Agent, or Firm—Theodore F. Neils

[57] ABSTRACT

Methods are disclosed for providing self-aligned barrier and conductor regions in conductively connected charge-coupled devices.

12 Claims, 8 Drawing Figures

METHOD FOR PROVIDING SEMICONDUCTOR DEVICES

BACKGROUND OF THE INVENTION

The invention herein relates to providing semiconductor devices with charge-coupled devices. More particularly, the invention relates to providing self-aligned barrier and conductive regions in conductively connected charge-coupled devices.

The introduction of charge-coupled devices (CCD's) in recent years has given promise of monolithic integrated circuits having a very high component device density for performing several signal processing functions. Both digital signal processing functions and analog signal processing functions can be performed by charge-coupled devices.

Among the various charge-coupled devices proposed to date is the conductively connected charge-coupled device (C4D) originally proposed by Krambeck, Strain, Smith and Pickar in an article entitled "Conductively Connected Charge-Coupled Device" published in the IEEE Transactions on Electron Devices, Vol. Ed-21, No. 1, January 1974. While there are some difficulties associated with the conductively connected charge-coupled devices concerning transfer efficiency, there are also several attractive features including operation with two-phase clocking without the need for overlapping electrodes in the storage and transfer regions. In these devices, each transfer region contains a barrier region under the electrodes and contains a connecting conductive region between the electrodes. The storage regions also occurs under the electrodes.

Typically, a two-phase charge-coupled device monolithic integrated circuit contains a sequence of storage and transfer regions alternating with one another in the silicon below an insulating layer supporting the component device electrodes. As indicated above, there is one region of each kind, storage or transfer, for each CCD component device and the sequence of alternating regions, or the sequence of CCD component devices, is provided in a generally linear geometrical arrangement. Often, however, a single line of such devices in the integrated circuit is insufficient in number for the signal processing function to be performed. Hence, the entire device sequence for performing a processing function is often formed by folding lines of devices back and forth one or more times in serpentine fashion to form a signal processing sequence having parallel lines of devices. Since the entire sequence is constructed in a single fabrication process, if the barrier region for a component device in a C4D integrated circuit is misaligned with the corresponding component device electrode in a first line of component devices in a signal processing sequence, the barrier region for a component device in an adjacent line of devices in the sequence will be misaligned with its component device electrode in the opposite direction.

This misalignment of barrier regions with corresponding device electrodes in one direction in alternate device lines in a processing sequence and misalignment in the opposite direction in the remaining device lines in the signal processing sequence, leads to varying transfer characteristics among the component devices by device lines throughout a sequence. This is because the component devices in alternate device lines in the signal processing sequence will have areas adjacent to the insulating layer of different sizes in the device storage regions. Thus, there will be difficulties when a packet of charge in the component device at the end of one device line, if this is a line having component devices with larger storage region areas, is transferred to the adjacent device line having component devices with smaller storage region areas. The full packet of charge from the first line is in part spilled forward when reaching the adjacent line. The result is that the original size of the charge packet in the first device line is reduced and the spilled forward charge represents false information in the second device line. Therefore, having self-aligned barrier regions with respect to corresponding component device electrodes for each component device is very desirable to avoid having storage areas of different sizes occur in the various component devices.

SUMMARY OF THE INVENTION

A method is disclosed for providing self-aligned conductively connected charge-coupled devices by (i) providing in a semiconductor layer between electrodes the dopant for the barrier region and thereafter migrating this dopant a selected distance under an adjacent electrode, this followed by providing the connecting conductive region in the semiconductor layer between the electrodes, or by (ii) providing in a semiconductor layer in an initial area between electrodes the dopant material for the barrier region and then enlarging one of these electrodes to overlap this initial area a selected distance and thereby forming the barrier region, this followed by providing the connecting conductive region between these electrodes as enlarged. These steps can be accomplished using standard ion implantation or standard diffusion techniques or both.

DESCRIPTION OF THE PREFERRED EMBODIMENTS

Figure 1A:
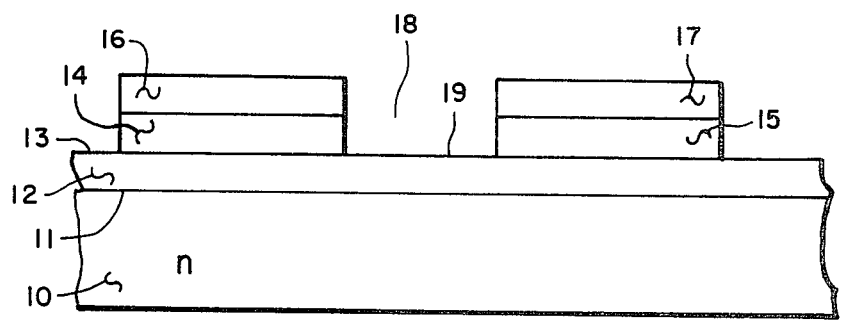
FIG. 1 (A-D) shows the results of steps in a method of the present invention, and FIG. 2 (A-D) presents the results of steps in an alternative method of the present invention.

Turning to FIG. 1A, the method shown in FIG. 1 begins with providing a silicon semiconductor material substrate, 10, of n-type conductivity having an outer major surface, 11. Substrate 10 has a resistivity of 5 to 10 $\Omega$-cm.

In (i) separating from one another various device lines occurring in a signal processing sequence of conductively connected charge-coupled component devices, and in (ii) providing separated MOS transistors in the same monolithic integrated circuit as these charge-coupled component devices, there is required a thick "field" oxide to prevent undesired electrical interaction between interconnection metallization network lines and underlying devices, etc. Thus, the first step concerning substrate 10 is to provide thereon such a field oxide of 8,000 A by thermally growing silicon dioxide (SiO$_2$) in an atmosphere of wet oxygen. This is followed by using a standard photoresist process to provide openings at selected locations in that field oxide down to outer major surface 11 where device lines of charge-coupled component devices are to be provided and where MOS transistors are to be provided. The results of these steps are not shown in FIG. 1A as they are standard processing steps in providing MOS transistor and charge-coupled device monolithic integrated circuits.

In the above locations where the field oxide has been opened, a thin "gate" oxide is provided by thermally growing SiO₂ on exposed outer major surface 11 to a thickness of approximately 1,000 A by raising substrate 10, with the field oxide thereon as selectively opened, to 1,050° C in dry oxygen for 90 minutes. The result is an SiO₂ insulating layer or gate oxide, designated 12 in FIG. 1A, having an insulating layer surface, 13. The thickness of layer 12 is also suitable for serving beneath the gates of MOS transistors being concurrently provided with the CCD structures in the monolithic integrated circuit. No background indication of the field oxide are provided in FIG. 1 to keep the presentation as uncluttered as possible even though complete accuracy would require such indications.

Thereafter, an electrode material is deposited on surface 13. Typically, polysilicon is used but other refractory metals such as molybdenum or tungsten could also be used in the alternative. In the present method, polysilicon is used which is provided in a layer on surface 13 to a depth of 5,000 to 8,000 A by standard chemical vapor deposition techniques. This polysilicon layer may be provided initially as a layer doped with boron atoms in a concentration of approximately $10^{19}$ atoms/cm$^3$ or provided initially undoped to be later doped in the process. The latter step is chosen here.

A masking layer of SiO₂ is formed on the undoped polysilicon by thermal oxidation as in a standard process. Then a photoresist layer is provided on the SiO₂ masking layer using a standard photoresist process to leave only a portion of the photoresist layer where photoresist is desired to mask locations below which electrodes are to be provided for the charge-coupled component devices. The SiO₂ masking layer is etched away through these openings in the photoresist layer using buffered hydrofluoric acid in a 20:1 ratio. The photoresist masking portions are then removed entirely, and another etching step is performed to etch away the undoped polysilicon at locations where it is not protected by the remaining portions of the SiO₂ masking layer. The result is shown in FIG. 1A where polysilicon portions to serve as electrodes —as yet undoped—are shown, designated 14 and 15, having SiO₂ masking layer portions 16 and 17 remaining thereon.

The electrodes 14 and 15 are, of course, repeated many times along the device lines in the signal processing sequence of charge-coupled component devices, i.e., there are presumably two or more device lines in the signal processing sequence C4D to provide the signal processing function required of the sequence. Only two charge-coupled component device electrodes are shown here as the provision of the remaining charge-coupled component devices occurs simultaneously with and similar to the provision of the charge-coupled component device shown in FIG. 1. Also, of course, there is simultaneously provided the MOS transistors desired in the monolithic integrated circuit to be used with the C4D sequences therein.

The opening between electrodes 14 and 15, marked 18 in FIG. 1A, expose an area in surface 13 which is labeled 19. Below area 19 in semiconductor substrate 10, is the transfer region for a charge-coupled device. This transfer region is located between the storage region in silicon substrate 10 occurring under electrode 15 for a charge-coupled component device and the storge region occurring under electrode 14 for the previous charge-coupled component device. To be also provided under electrodes 14 and 15 are barrier regions to give the charge packets transferred between the charge-coupled devices flow directionality.

At this point, the dopant for the barrier regions to be formed under electrodes 14 and 15 must be introduced in substrate 10 in the openings between the electrodes including through area 19 in surface 13 of FIG. 1A. This introduction of dopant is to be accomplished by ion implantation. The dopant, as introduced, must be located asymmetrically in substrate below area 19 so that the result of the subsequent step of migrating the dopant a selected distance under electrode 15 occurs without also migrating under electrode 14 this same dopant introduced through area 19. This asymmetry is accomplished by providing a blocking layer which covers but a portion of area 19 to prevent ion implantation below that covered portion.

This blocking layer is a photoresist layer deposited on the structure of FIG. 1A with openings provided by a standard photoresist process in the photoresist layer exposing a portion of layer 13 in the openings between charge-coupled component device electrodes including exposing a portion of area 19. As long as a portion of area 19 is exposed adjacent to electrode 15, the size of the particular portion exposed is not important and so the alignment of the openings in the photoresist layer with respect to the electrodes is not especially important either. A small exposure of area 19 mens that there will be a correspondingly large exposure of surfaces between electrodes in the charge-coupled component devices provided in adjacent device lines in the signal processing sequence. However, neither a small exposure nor a large exposure makes any difference, because the regions in substrate 10 between electrodes will all have a self-aligned connecting conductive region of an opposite conductivity type provided therein. These latter regions will entirely compensate the storage regions and deviate any differences in the amount of barrier region dopant introduced in substrate 10 between electrodes.

Figure 1B:
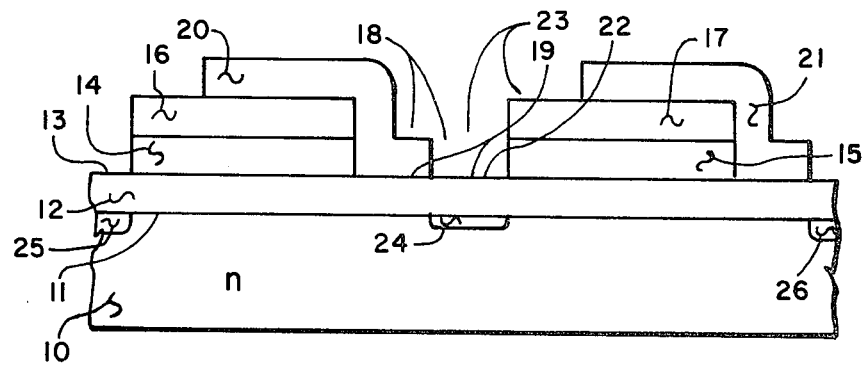

The result of providing the photoresist layer with openings exposing portions of the surface between electrodes is shown in FIG. 1B where the remaining portions of the photoresist shown are labeled 20 and 21, respectively. The exposed portion of area 19 in surface 13 has been designated by the numeral 22. The opening between photoresist layers 20 and 21 has been designated by the numeral 23. The opening 23 serves as an ion implantation opening in the photoresist blocking layer.

Also to be noticed, the distance across area 22 between photoresist portion 20 and electrode 15 can be smaller than the smallest opening allowed in a photoresist layer by standard photoresist processing techniques. This means that very small charge-coupled component devices can be fabricated.

With the blocking layer thus provided, an ion implantation step is performed to implant phosphorus ions into semiconductor substrate 10 through the openings in the blocking layer, including opening 23, and through SiO₂ insulating layer 12, including below area 22, which serves as a scattering layer. This scattering effect of layer 12 is needed to cause scattering of impinging ions in the ion implantation step so that these impinging ions do not happen to line up with the silicon lattice in semiconductor substrate 10. Should such an alignment occur, the impinging ions would go much deeper than expected into substrate 10 for a given average ion energy in the absence of layer 12.

This phosphorus ion implantation step is performed with an energy of 100 to 150 kev and with a dose of 1.5 to 2.0 × $10^{12}$ atoms/cm$^2$. The result is an N$^+$-type conductivity region, 24, formed below surface portion 22. That is, not only do photoresist portions 20 and 21 in conjunction with layer 12 block the implantation of ions in substrate 10, but also the electrode-oxide cap combinations 14 and 16, on the one hand, and 15 and 17 on the other hand, are capable of preventing the implantation of ions in substrate 10 in conjunction with layer 12. Similar regions of barrier region dopant are introduced in the other transfer regions and two of these are partially shown, regions 25 and 26.

The remaining portions of the photoresist layer, 21 and 22, are removed. Thereafter, the structure is subjected to an annealing-diffusion temperature cycle to enlarge each of regions 24, 25 and 26 a precise amount by diffusion in substrate 10 beneath adjacent electrodes including electrode 15 with respect to region 24. Since all of the regions formed by the introduction of the barrier region dopant are formed at the edge of an electrode and since all of these regions will be subjected to the same annealing-diffusion temperature cycle, the enlargement of these regions underneath their corresponding electrodes will all be approximately the same to thereby provide a self-aligned barrier region under these corresponding electrodes with respect to the electrode edges to result in uniform storage regions. That is, the lateral diffusion under electrode 15 will be approximately the same as the lateral diffusions under other electrodes present in the charge-coupled component device sequence.

Figure 1C:
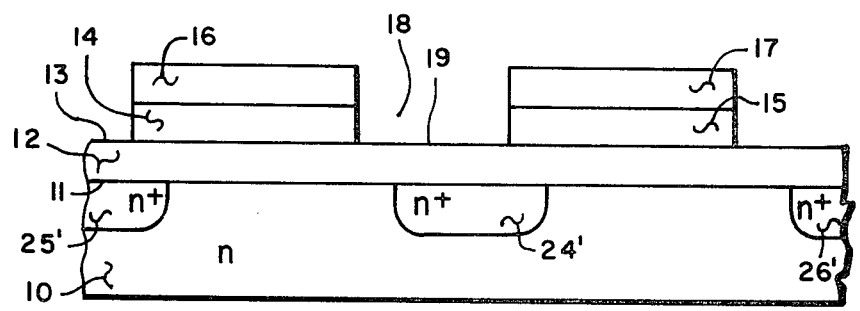

The region resulting from the enlargement of the regions provided by introducing the barrier region dopant are shown in FIG. 1C and have been designated there as 24', 25' and 26'. The lateral diffusion of region 24 to form region 24' is about 2μm underneath electrode 15. This amount of lateral diffusion is caused by exposing the structure of FIG. 1B absent the photoresist to a temperature of 1,100° C for about one hour. This temperature cycle also electrically activates the implanted phosphorus ions.

Upon completion of the above annealing-diffusion temperature cycle, the connecting conductive region is to be provided in substrate 10 between electrodes. If it is chosen to provide the connecting conductive regions by diffusion, the masking layer SiO$_2$ portions, including portions 16 and 17 on electrodes 14 and 15, and the portions of layer 12 exposed between the electrodes are removed by etching in a standard etching process. Thereafter, a diffusion step into substrate 10 and into polysilicon electrodes 14 and 15 would be performed.

Here, however, a second implantation step is chosen to be performed, alternative to such a diffusion step, to implant boron ions into semiconductor substrate 10 through the exposed areas between electrodes including through area 19. The electrodes 14 and 15, with masking layers 16 and 17, respectively, serve as part of an ion implantation mask to limit the implantation of boron ions in substrate 10 to occurring in only those locations between electrodes. However, the electrodes 14 and 15 are themselves heavily doped by the implanted boron ions to render them electrically conductive. Whatever in the way of phosphorus atoms reside in the electrodes 14 and 15, as a result of the first ion implantation step involving phosphorus ions is completely compensated by the much heavier boron ion dose used during the secnd implantation step.

Figure 1D:
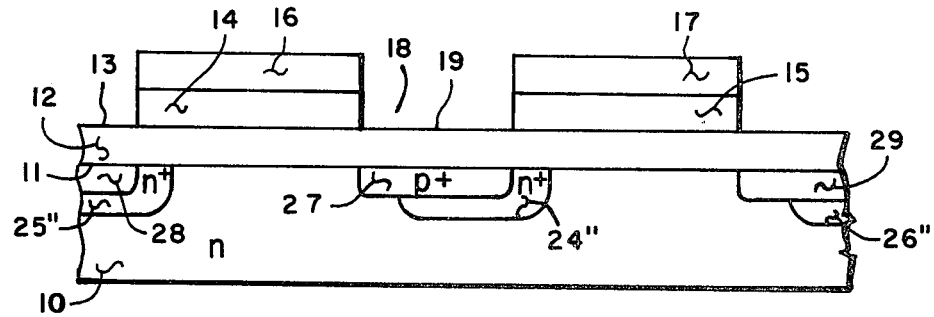

That dose of boron ions is to be 1.0 × $10^{14}$ to 1.0 × $10^{15}$ atoms/cm$^2$. These ions are implanted with an energy which is again between 100 and 150 kev. The result is shown in FIG. 1D where a relatively heavily doped p$^+$-type conductivity region, 27, is formed in the transfer region which occurs in substrate 10 below area 19 and extends between electrodes 14 and 15. Actually, there will be slightly greater extent because after the implantation step, the structure shown in FIG. 1D undergoes an annealing step at 950° C for 15 minutes causing a slight diffusion. Also similarly formed by the second implantation and shown in FIG. 1D are regions 28 and 29. In this same implantation there would be formed the sources and the drains of the MOS transistors desired to also be provided in the monolithic integrated circuit.

The resulting regions 27, 28 and 29 act as conductor region because of the relatively high doping. The portion of what was region 24' to the right of region 27 forms the barrier region in the storage region occurring in substrate 10 underneath electrode 15. This remaining portion of region 24' has been re-designated region 24", as region 24' has been diminished to an extent by compensation through the formation of conductive region 27. Also, regions 25' and 26' are re-designated as regions 25" and 26".

Easily seen is that region 27 is also self-aligned with respect to electrodes 14 and 15 as is true of the other connecting conductive regions with respect to electrodes corresponding to them. The result is that both connecting conductive region 27 and barrier region 24" are jointly self-aligned with respect to electrodes 14 and 15. This not only provides for uniformity of storage regions between the conductively connected charge-coupled component devices in all device lines in a signal processing sequence of such devices, but also permits smaller component devices to be manufactured all along the processing sequence, as the self-aligning feature reduces the masked tolerance required. From this point onward, the fabrication process continues by providing passivation and protective layers and a metallization interconnection network as needed by standard processing techniques.

Figure 2A:
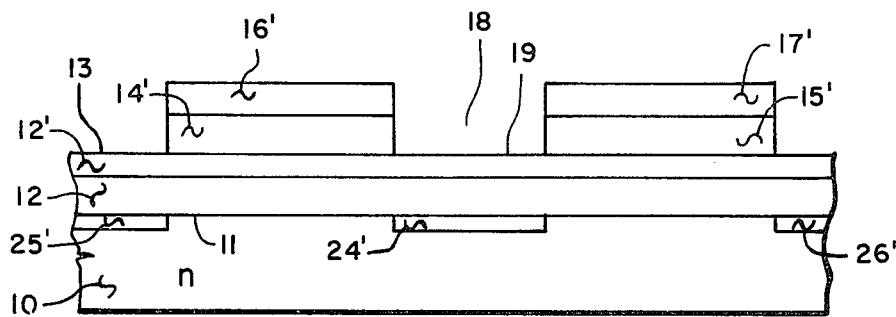

An alternative manner of providing a self-aligned charge-coupled component device is to provide the barrier region dopant as before, but rather than enlarging this dopant region underneath the electrode, the electrode is enlarged to cover a portion of this region formed by the barrier region dopant. Turning to FIG. 2A, a silicon substrate is again provided of n-type conductivity and having a 5 to 10 Ω-cm resistivity. A thick field oxide is again provided and etched open where device lines of charge-coupled component devices for a signal process sequence are to be provided and where MOS transistors are to be provided. The silicon substrate is again designated by the numeral 10 with outer major surface 11.

However, rather than just a gate oxide layer or insulating layer consisting of SiO$_2$ alone, the insulating layer now contains an SiO$_2$ strata, 12, and a silicon nitride (Si$_3$N$_4$) strata, 12', to form a two-strata insulating layer having an insulating layer surface, 13. Layer 12 is 700 A thick, while layer 12' is 500 A thick. Layer 12 is provided by a standard thermal oxidation process and layer 12' is provided by a standard chemical vapor deposition process.

Polysilicon electrodes are provided in the manner described in connection with FIG. 1. The only difference here is that these polysilicon electrodes are to be doped with boron atoms during fabrication by a standard chemical vapor deposition process resulting in polysilicon having a concentration of approximately $10^{19}$ atoms/cm$^3$ and so are now designated 14' and 15'. Also, the remaining SiO$_2$ masking portions used in etching the doped polysilicon must now be thick enough to prevent the phosphorus ions, to be implanted as the barrier region dopant, from counter doping the doped polysilicon electrodes 14' and 15' during implantation. That is, the masking layer remaining portions should have a thickness of at least 3,000 A and so now bear the changed labels 16' and 17'. The opening between electrodes 14' and 15' is again labeled 18 and this opening exposes area 19 of surface 13.

At this point, a phosphorus ion implantation step is undertaken in the openings between the electrode-masking layer combinations already provided, using these combinations as ion implantation masks, including implanting in opening 18 between electrode-masking layer combinations 14' and 16', on the one hand, and 15' and 17' on the other hand. This step is again performed using an energy of 100 to 150 kev with a dose of 1.5 to 2.0 × 10$^{12}$ atoms/cm$^2$. The result is shown in FIG. 2A where n$^+$-type conductivity regions are again formed which are labeled here 24', 25' and 26'.

Remaining portions of the SiO$_2$ masking layer, including portions 16' and 17', are now etched away using buffered hydrofluoric acid in a standard process. The purpose of Si$_3$N$_4$ layer 12' is now evident as it serves to protect layer 12 between electrodes from being etched while masking layer portions 16' and 17' are etched away. The result after etching is shown in FIG. 2B.

Figure 2B:
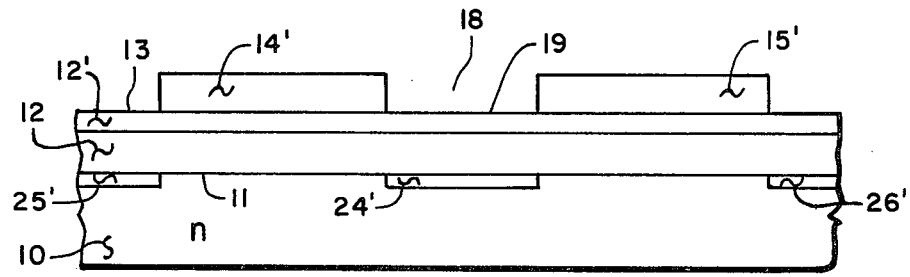
Figure 2C:
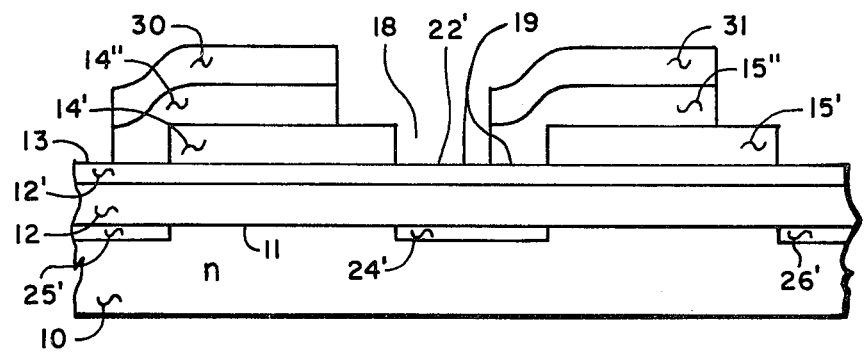

Thereafter, a second polysilicon layer of undoped polysilicon is deposited by standard chemical vapor depositing process over the structure shown in FIG. 2B. This second layer of undoped polysilicon has a masking layer of SiO$_2$ provided thereover and the same general process steps previously described are used to provide openings in this second layer of undoped polysilicon in such a manner as to expose portions of areas between the electrodes including a portion of area 19 adjacent to electrode 14'. The result is shown in FIG. 2C where the exposed portion of area 19 is designated 22'. This provides additional polysilicon electrodes (which are doped in a later step to increase electrode conductivity) serving to enlarge the electroded areas of surface 13.

However, there is a difference in the polysilicon etching process used here as compared to the earlier polysilicon etching step in that the etchant here must not attack the doped polysilicon in electrodes 14' and 15' nor the Si$_3$N$_4$ layer. Electrodes 14' and 15' must not be etched away because this would affect the size of the storage region thereunder in substrate 10.

This is satisfactorily accomplished by a differential etching process, using an etchant solution of nitric, hydrofluoric and acetic acids in a ratio of 100:1:110, which yields an approximately 10:1 etching rate ratio between the undoped polysilicon and the boron doped polysilicon.

The added polysilicon electrodes are designated by numerals 14" and 15", and when doped will have the effect of extending the shown electroded surface area of surface 13 from that initially under the original electrodes 14' and 15' to that surface area under electrodes 14" and 15" and under electrodes 14' and 15'. That extended portion of the electroded area of surface 13, such as due to electrodes 14" and 15", will be over a portion of each of the initially implanted regions including regions 24', 25', and 26'. These portions of regions 24', 25' and 26' will then serve as the barrier regions in the transfer regions. The storage regions are defined by the electrodes 14' and 15' and are therefore of uniform size along insulating layer 12. The second masking layer portion remaining on electrode 14", designated 30, and upon electrode 15", designated 31, are of a thickness of a scattering oxide. This is so that, during a subsequent implantation step, electrodes 14" and 15" will be doped by the implanted ions to thereby become electrically conductive.

Again, because the second set of polysilicon electrodes is formed by offset masking, area 22' can be smaller than the minimum opening size allowed in a photoresist layer by standard photoresist processing.

Then the second implantation step using boron ions is performed. Once again, the energy is between 100 and 150 kev with a dose of 1.0 × 10$^{14}$ to 2.0 × 10$^{15}$ atoms/cm$^2$. The result is regions 27', 28' and 29' shown in FIG. 2D. These regions serve as connecting conductive regions as do the other regions similarly provided but not shown for the charge-coupled component devices in the monolithic integrated circuit. MOS transistor source and drains are provided simultaneously with this second implantation step. Regions 24' and 25' have been relabeled 24" and 25" in FIG. 2D while the portion of region 26' shown in FIG. 2C has been completely compensated. The added electrodes 14' and 15' have been re-designated 14'" and 15'" to indicate they are now doped.

Figure 2D:
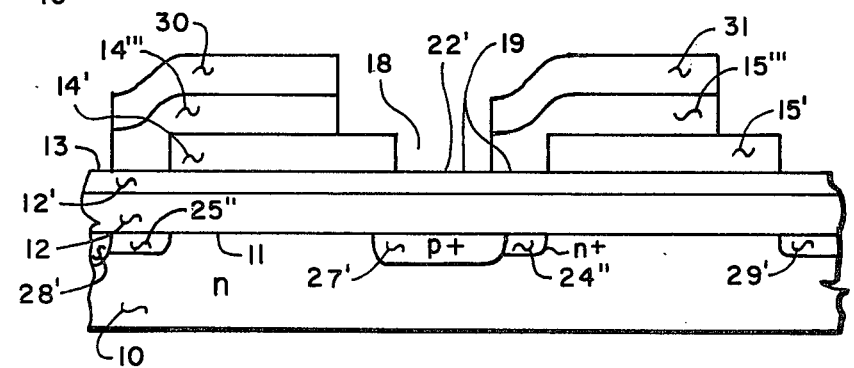

To assure regions 27', 28' and 29' of FIG. 2D include all of regions 24', 25' and 26' of FIG. 2C below area 22', the annealing cycle following the second implantation is conducted at a somewhat higher than typical temperature to promote lateral diffusion of the boron implanted through area 22'. Thus, this annealing cycle takes place at 1,100° C for 15 minutes.

Again, the final implantation step could have a diffusion step substituted therefor. To accomplish this, at the end of the steps shown in FIG. 1C, an etching solution would be applied to the structure shown there to remove the Si$_3$N$_4$ exposed in area 22' of surface 13 and exposed similarly in other locations to be followed by another etching step to remove remaining portions of the SiO$_2$ masking layer, such as regions 30 and 31. Simultaneously removed would be the exposed portion of layer 12 occurring after the etching away of layer 12' below area 22'. A slight over etch is used to enlarge the opening in layer 12 to assure that the subsequent boron diffusion step will provide connective conducting regions which will include all of regions 24', 25' and 26' of FIG. 2C below what was area 22'. Thereafter, a diffusion cycle is provided to diffuse boron into substrate 10 and into electrodes 14" and 15".

After either the second ion implantation step or its substitute diffusion step, a double layer of SiO$_2$ is provided, growing the first couple thousand Angstroms and chemically vapor depositing several thousand Angstroms more. Openings are provided in this layer where necessary to provide a metallization network to contact extended electrodes 14' and 14'", on the one hand, and 15' and 15'", on the other hand, and to contact similar electrodes along the C4D signal processing sequence. Also, the electrical contact is made at the same time to drains, sources and gates of the MOS transistors formed simultaneously with the charge-coupled component devices. A further passivation and protection oxide layer may then be provided.

The embodiments of the invention in which an exclusive property or right is claimed are defined as follows:

1. A method for constructing a self-aligned conductively connected charge-coupled device through use of a first semiconductor material layer of a first conductivity type and of a first conductivity, said first semiconductor material layer having an outer major surface with a first insulating layer provided thereon, said first insulating layer having a first insulating layer surface not in contact with said outer major surface, said method comprising:

providing a plurality of sequential, spaced apart electrodes on said first insulating layer surface including first and second electrodes, said first and second electrodes, in being spaced apart as aforesaid, exposing between them a first area of said first insulating layer surface to thereby provide an electroded structure;

providing a first blocking material layer on said electroded structure where said first blocking material layer is capable, as provided and where not opened, of preventing implantation in said first semiconductor material layer of any kinds of ions which are to be implanted in said first semiconductor material layer in a manner set out in any implantation steps following in said method in which said first blocking material layer is present, said first blocking material layer having a first ion implantation opening therein which exposes only a portion of said first area;

implanting ions of a first kind in said first semiconductor material layer, as a first implantation, by impinging said first kind ions on said electroded structure with said first blocking material layer including impinging them through said first ion implantation opening to thereby form a first region in said first semiconductor material layer of a second conductivity type;

enlarging said first region by diffusion to become an enlarged first region of said second conductivity type and of a second conductivity which extends laterally in said first semiconductor material layer to locations therein both beyond projections of said first area in said first semiconductor material layer and within projections in said first semiconductor material layer of a selected one of said first and second electrodes; and providing a second region in said first semiconductor material layer of a third conductivity type extending laterally in said first semiconductor material layer at least between projections therein of said first and second electrodes.

2. The method of claim 1 wherein said plurality of sequential, spaced apart electrodes are polysilicon, said first semiconductor layer is silicon and said first insulating layer is silicon dioxide.

3. The method of claim 2 wherein said polysilicon electrodes having a masking layer of silicon dioxide thereon and said blocking layer is a photoresist layer and is in part supported by at least one of said first and second electrodes as masked by said silicon dioxide masking layer.

4. The method of claim 2 wherein said providing of said second region is accomplished by implanting ions of a second kind in said first semiconductor material layer, as a second implantation, while simultaneously implanting said second kind ions in said electrodes to increase electrode conductivity.

5. The method of claim 2 wherein said providing of said second region is accomplished by opening said first insulating layer and diffusing a surface-introduced diffusant into said frist semiconductor material layer while simultaneously diffusing said surface-introduced diffusant in said electrodes to increase electrode conductivity.

6. The method of claim 2 wherein said second conductivity type is said first conductivity type, also, with both being opposite said third conductivity type.

7. A method for constructing a self-aligned conductively connected charge-coupled device through use of a first semiconductor material layer of a first conductivity type and of a first conductivity, said first semiconductor material layer having an outer major surface with a first insulating layer provided thereon, said first insulating layer having a first insulating layer surface not in contact with said outer major surface, said method comprising:

providing a first plurality of sequential, spaced apart electrodes on said first insulating layer surface including first and second electrodes, said first and second electrodes, in being spaced apart as aforesaid, exposing between them a first area of said first insulating layer surface to thereby provide an electroded structure;

implanting ions of a first kind in said first semiconductor material layer, as a first implantation, by impinging said first kind ions on said electroded structure including impinging them through said first area to thereby form a first region in said first semiconductor material layer of a second conductivity type and of a second conductivity;

providing a second plurality of spaced apart electrodes where (i) each of said second plurality of spaced apart electrodes is in contact with a corresponding one of said first plurality of spaced apart electrodes, and (ii) where each of said second plurality of spaced apart electrodes occurs at least in part on said first insulating layer surface between spacings of first plurality of spaced apart electrodes, said second plurality of spaced apart electrodes including third and fourth electrodes which are in contact as aforesaid with said first and second electrodes, respectively, and where at least a portion of said third electrode is supported by said first area as aforesaid; sand providing a second region in said first semiconductor material of a third conductivity type extending laterally in said first semiconductor material layer at least between projections therein of said second and third electrodes.

8. The method of claim 7 wherein said plurality of sequential, spaced apart electrodes are polysilicon, said first semiconductor layer is silicon and said first insulating layer is in two strata having a silicon dioxide strata on said first semiconductor layer and a silicon nitride strata on said silicon dioxide strata.

9. The method of claim 8 wherein said first, second, third and fourth electrodes are all polysilicon with said first electrode directly supporting in part said third electrode and with said second electrode directly supporting in part said fourth electrode, said first and second electrodes being doped as provided and said third and fourth electrodes being undoped as provided.

10. The method of claim 9 wherein said providing of said second region is accomplished by implanting ions of a second kind in said first semiconductor material layer, as a second implantation, while simultaneously implanting said second kind ions in said third and fourth electrodes to increase electrode conductivity, said first and third electrodes being in electrical contact and said second and fourth electrodes being in electrical contact.

11. The method of claim 9 wherein said providing of said second region is accomplished by opening said first insulating layer and diffusing a first dopant into said first semiconductor material layer while simultaneously diffusing said first dopant in said third and fourth electrodes to increase electrode conductivity, said first and third electrodes being in electrical contact and said second and fourth electrodes being in electrical contact.

12. The method of claim 9 wherein said second conductivity type is said first conductivity type, also, with both being opposite said third conductivity type.

* * * * *